(12) United States Patent
Mishra et al.

(10) Patent No.: US 9,490,324 B2
(45) Date of Patent: *Nov. 8, 2016

(54) N-POLAR III-NITRIDE TRANSISTORS

(71) Applicant: Transphorm Inc., Goleta, CA (US)

(72) Inventors: Umesh Mishra, Montecito, CA (US); Srabanti Chowdhury, Goleta, CA (US); Carl Joseph Neufeld, Goleta, CA (US)

(73) Assignee: Transphorm Inc., Goleta, CA (US)

( * ) Notice: Subject to any disclaimer, the term of this patent is extended or adjusted under 35 U.S.C. 154(b) by 4 days.

This patent is subject to a terminal disclaimer.

(21) Appl. No.: 14/744,526

(22) Filed: Jun. 19, 2015

(65) Prior Publication Data

US 2015/0287785 A1 Oct. 8, 2015

Related U.S. Application Data

(63) Continuation of application No. 13/859,635, filed on Apr. 9, 2013, now Pat. No. 9,093,366.

(60) Provisional application No. 61/621,956, filed on Apr. 9, 2012.

(51) Int. Cl.
*H01L 29/66* (2006.01)
*H01L 29/10* (2006.01)
(Continued)

(52) U.S. Cl.
CPC ......... *H01L 29/1054* (2013.01); *H01L 29/045* (2013.01); *H01L 29/2003* (2013.01); *H01L29/205* (2013.01); *H01L 29/66462* (2013.01); *H01L 29/7781* (2013.01); *H01L 29/7785* (2013.01); *H01L 29/78* (2013.01)

(58) Field of Classification Search
CPC ...................... H01L 29/7781; H01L 29/1054
USPC ......................................................... 257/192
See application file for complete search history.

(56) References Cited

U.S. PATENT DOCUMENTS 4,300,091 A 11/1981 Schade, Jr.
4,532,439 A 7/1985 Koike
(Continued)

FOREIGN PATENT DOCUMENTS

CN 1748320 3/2006
CN 101107713 1/2008
(Continued)

OTHER PUBLICATIONS

Authorized officer Chung Keun Lee, International Search Report and Written Opinion in PCT/US2008/076030, mailed Mar. 23, 2009, 10 pages.
(Continued)

*Primary Examiner* — Ajay K Arora
(74) *Attorney, Agent, or Firm* — Fish & Richardson P.C.

(57) ABSTRACT

An N-polar III-N transistor includes a III-N buffer layer, a first III-N barrier layer, and a III-N channel layer, the III-N channel layer having a gate region and a plurality of access regions on opposite sides of the gate region. The compositional difference between the first III-N barrier layer and the III-N channel layer causes a conductive channel to be induced in the access regions of the III-N channel layer. The transistor also includes a source, a gate, a drain, and a second III-N barrier layer between the gate and the III-N channel layer. The second III-N barrier layer has an N-face proximal to the gate and a group-III face opposite the N-face, and has a larger bandgap than the III-N channel layer. The lattice constant of the first III-N barrier layer is within 0.5% of the lattice constant of the buffer layer.

39 Claims, 4 Drawing Sheets

(51) Int. Cl.
   *H01L 29/205* (2006.01)
   *H01L 29/78* (2006.01)
   *H01L 29/778* (2006.01)
   *H01L 29/20* (2006.01)
   *H01L 29/04* (2006.01)

(56) References Cited

U.S. PATENT DOCUMENTS

| | | |
|---|---|---|
| 4,645,562 A | 2/1987 | Liao et al. |
| 4,728,826 A | 3/1988 | Einzinger et al. |
| 4,821,093 A | 4/1989 | Iafrate et al. |
| 4,914,489 A | 4/1990 | Awano |
| 5,051,618 A | 9/1991 | Lou |
| 5,329,147 A | 7/1994 | Vo et al. |
| 5,618,384 A | 4/1997 | Chan et al. |
| 5,646,069 A | 7/1997 | Jelloian et al. |
| 5,663,091 A | 9/1997 | Yen et al. |
| 5,705,847 A | 1/1998 | Kashiwa et al. |
| 5,714,393 A | 2/1998 | Wild et al. |
| 5,909,103 A | 6/1999 | Williams |
| 5,998,810 A | 12/1999 | Hatano et al. |
| 6,008,684 A | 12/1999 | Ker et al. |
| 6,097,046 A | 8/2000 | Plumton |
| 6,100,571 A | 8/2000 | Mizuta et al. |
| 6,292,500 B1 | 9/2001 | Kouchi et al. |
| 6,307,220 B1 | 10/2001 | Yamazaki |
| 6,316,793 B1 | 11/2001 | Sheppard et al. |
| 6,373,082 B1 | 4/2002 | Ohno et al. |
| 6,429,468 B1 | 8/2002 | Hsu et al. |
| 6,475,889 B1 | 11/2002 | Ring |
| 6,486,502 B1 | 11/2002 | Sheppard et al. |
| 6,504,235 B2 | 1/2003 | Schmitz et al. |
| 6,515,303 B2 | 2/2003 | Ring |
| 6,548,333 B2 | 4/2003 | Smith |
| 6,552,373 B2 | 4/2003 | Ando et al. |
| 6,580,101 B2 | 6/2003 | Yoshida |
| 6,583,454 B2 | 6/2003 | Sheppard et al. |
| 6,586,781 B2 | 7/2003 | Wu et al. |
| 6,624,452 B2 | 9/2003 | Yu et al. |
| 6,649,497 B2 | 11/2003 | Ring |
| 6,727,531 B1 | 4/2004 | Redwing et al. |
| 6,746,938 B2 | 6/2004 | Uchiyama et al. |
| 6,777,278 B2 | 8/2004 | Smith |
| 6,849,882 B2 | 2/2005 | Chavarkar et al. |
| 6,867,078 B1 | 3/2005 | Green et al. |
| 6,914,273 B2 | 7/2005 | Ren et al. |
| 6,946,739 B2 | 9/2005 | Ring |
| 6,979,863 B2 | 12/2005 | Ryu |
| 6,982,204 B2 | 1/2006 | Saxler et al. |
| 7,030,428 B2 | 4/2006 | Saxler |
| 7,038,252 B2 | 5/2006 | Saito et al. |
| 7,045,404 B2 | 5/2006 | Sheppard et al. |
| 7,053,413 B2 | 5/2006 | D'Evelyn et al. |
| 7,071,498 B2 | 7/2006 | Johnson et al. |
| 7,078,743 B2 | 7/2006 | Murata et al. |
| 7,084,475 B2 | 8/2006 | Shelton et al. |
| 7,109,552 B2 | 9/2006 | Wu |
| 7,125,786 B2 | 10/2006 | Ring et al. |
| 7,126,212 B2 | 10/2006 | Enquist et al. |
| 7,161,194 B2 | 1/2007 | Parikh et al. |
| 7,169,634 B2 | 1/2007 | Zhao et al. |
| 7,170,111 B2 | 1/2007 | Saxler |
| 7,199,640 B2 | 4/2007 | De Cremoux et al. |
| 7,217,960 B2 | 5/2007 | Ueno et al. |
| 7,230,284 B2 | 6/2007 | Parikh et al. |
| 7,238,560 B2 | 7/2007 | Sheppard et al. |
| 7,250,641 B2 | 7/2007 | Saito et al. |
| 7,253,454 B2 | 8/2007 | Saxler |
| 7,265,399 B2 | 9/2007 | Sriram et al. |
| 7,268,375 B2 | 9/2007 | Shur et al. |
| 7,304,331 B2 | 12/2007 | Saito et al. |
| 7,321,132 B2 | 1/2008 | Robinson et al. |
| 7,326,971 B2 | 2/2008 | Harris et al. |
| 7,332,795 B2 | 2/2008 | Smith et al. |
| 7,364,988 B2 | 4/2008 | Harris et al. |
| 7,375,407 B2 | 5/2008 | Yanagihara et al. |
| 7,382,001 B2 | 6/2008 | Beach |
| 7,388,236 B2 | 6/2008 | Wu et al. |
| 7,419,892 B2 | 9/2008 | Sheppard et al. |
| 7,429,534 B2 | 9/2008 | Gaska et al. |
| 7,432,142 B2 | 10/2008 | Saxler et al. |
| 7,436,001 B2 | 10/2008 | Lee et al. |
| 7,449,730 B2 | 11/2008 | Kuraguchi |
| 7,456,443 B2 | 11/2008 | Saxler et al. |
| 7,465,967 B2 | 12/2008 | Smith et al. |
| 7,465,997 B2 | 12/2008 | Kinzer et al. |
| 7,482,788 B2 | 1/2009 | Yang |
| 7,488,992 B2 | 2/2009 | Robinson |
| 7,501,669 B2 | 3/2009 | Parikh et al. |
| 7,501,670 B2 | 3/2009 | Murphy |
| 7,508,014 B2 | 3/2009 | Tanimoto |
| 7,544,963 B2 | 6/2009 | Saxler |
| 7,547,925 B2 | 6/2009 | Wong et al. |
| 7,548,112 B2 | 6/2009 | Sheppard |
| 7,550,781 B2 | 6/2009 | Kinzer et al. |
| 7,550,783 B2 | 6/2009 | Wu et al. |
| 7,550,784 B2 | 6/2009 | Saxler et al. |
| 7,566,580 B2 | 7/2009 | Keller et al. |
| 7,566,918 B2 | 7/2009 | Wu et al. |
| 7,573,078 B2 | 8/2009 | Wu et al. |
| 7,592,211 B2 | 9/2009 | Sheppard et al. |
| 7,598,108 B2 | 10/2009 | Li et al. |
| 7,601,993 B2 | 10/2009 | Hoshi et al. |
| 7,605,017 B2 | 10/2009 | Hayashi et al. |
| 7,612,363 B2 | 11/2009 | Takeda et al. |
| 7,612,390 B2 | 11/2009 | Saxler et al. |
| 7,615,774 B2 | 11/2009 | Saxler |
| 7,629,627 B2 | 12/2009 | Mil'shtein et al. |
| 7,638,818 B2 | 12/2009 | Wu et al. |
| 7,655,962 B2 | 2/2010 | Simin et al. |
| 7,678,628 B2 | 3/2010 | Sheppard et al. |
| 7,692,263 B2 | 4/2010 | Wu et al. |
| 7,700,973 B2 | 4/2010 | Shen et al. |
| 7,709,269 B2 | 5/2010 | Smith et al. |
| 7,709,859 B2 | 5/2010 | Smith et al. |
| 7,714,360 B2 | 5/2010 | Otsuka et al. |
| 7,723,739 B2 | 5/2010 | Takano et al. |
| 7,728,356 B2 | 6/2010 | Suh et al. |
| 7,745,851 B2 | 6/2010 | Harris |
| 7,755,108 B2 | 7/2010 | Kuraguchi |
| 7,759,699 B2 | 7/2010 | Beach |
| 7,759,700 B2 | 7/2010 | Ueno et al. |
| 7,777,252 B2 | 8/2010 | Sugimoto et al. |
| 7,777,254 B2 | 8/2010 | Sato |
| 7,795,622 B2 | 9/2010 | Kikkawa et al. |
| 7,795,642 B2 | 9/2010 | Suh et al. |
| 7,811,872 B2 | 10/2010 | Hoshi et al. |
| 7,812,369 B2 | 10/2010 | Chini et al. |
| 7,834,380 B2 | 11/2010 | Ueda et al. |
| 7,851,825 B2 | 12/2010 | Suh et al. |
| 7,855,401 B2 | 12/2010 | Sheppard et al. |
| 7,859,014 B2 | 12/2010 | Nakayama et al. |
| 7,859,020 B2 | 12/2010 | Kikkawa et al. |
| 7,859,021 B2 | 12/2010 | Kaneko |
| 7,875,537 B2 | 1/2011 | Suvorov et al. |
| 7,875,907 B2 | 1/2011 | Honea et al. |
| 7,875,910 B2 | 1/2011 | Sheppard et al. |
| 7,875,914 B2 | 1/2011 | Sheppard |
| 7,884,394 B2 | 2/2011 | Wu et al. |
| 7,884,395 B2 | 2/2011 | Saito |
| 7,892,974 B2 | 2/2011 | Ring et al. |
| 7,893,424 B2 | 2/2011 | Eichler et al. |
| 7,893,500 B2 | 2/2011 | Wu et al. |
| 7,898,004 B2 | 3/2011 | Wu et al. |
| 7,901,994 B2 | 3/2011 | Saxler et al. |
| 7,906,799 B2 | 3/2011 | Sheppard et al. |
| 7,915,643 B2 | 3/2011 | Suh et al. |
| 7,915,644 B2 | 3/2011 | Wu et al. |
| 7,919,791 B2 | 4/2011 | Flynn et al. |
| 7,928,475 B2 | 4/2011 | Parikh et al. |
| 7,932,539 B2 | 4/2011 | Chen et al. |
| 7,935,985 B2 | 5/2011 | Mishra et al. |
| 7,939,391 B2 | 5/2011 | Suh et al. |
| 7,948,011 B2 | 5/2011 | Rajan et al. |

(56) References Cited

U.S. PATENT DOCUMENTS

| | | |
|---|---|---|
| 7,955,918 B2 | 6/2011 | Wu et al. |
| 7,955,984 B2 | 6/2011 | Ohki |
| 7,960,756 B2 | 6/2011 | Sheppard et al. |
| 7,965,126 B2 | 6/2011 | Honea et al. |
| 7,973,335 B2 | 7/2011 | Okamoto et al. |
| 7,982,242 B2 | 7/2011 | Goto |
| 7,985,986 B2 | 7/2011 | Heikman et al. |
| 7,985,987 B2 | 7/2011 | Kaneko |
| 8,039,352 B2 | 10/2011 | Mishra et al. |
| 8,044,380 B2 | 10/2011 | Lee |
| 8,049,252 B2 | 11/2011 | Smith et al. |
| 8,076,698 B2 | 12/2011 | Ueda et al. |
| 8,076,699 B2 | 12/2011 | Chen et al. |
| 8,093,606 B2 | 1/2012 | Sonobe et al. |
| 8,110,425 B2 | 2/2012 | Yun |
| 8,114,717 B2 | 2/2012 | Palacios et al. |
| 8,153,515 B2 | 4/2012 | Saxler |
| 8,174,048 B2 | 5/2012 | Beach |
| 8,178,900 B2 | 5/2012 | Kurachi et al. |
| 8,223,458 B2 | 7/2012 | Mochizuki et al. |
| 8,237,196 B2 | 8/2012 | Saito |
| 8,237,198 B2 | 8/2012 | Wu et al. |
| 8,264,003 B2 | 9/2012 | Herman |
| 8,361,816 B2 | 1/2013 | Lee et al. |
| 8,363,437 B2 | 1/2013 | Wang et al. |
| 8,389,975 B2 | 3/2013 | Kikuchi et al. |
| 8,390,000 B2 | 3/2013 | Chu et al. |
| 8,404,042 B2 | 3/2013 | Mizuhara et al. |
| 8,431,960 B2 | 4/2013 | Beach et al. |
| 8,455,885 B2 | 6/2013 | Keller et al. |
| 8,471,267 B2 | 6/2013 | Hayashi et al. |
| 8,476,125 B2 | 7/2013 | Khan et al. |
| 8,492,779 B2 | 7/2013 | Lee |
| 8,502,323 B2 | 8/2013 | Chen |
| 8,519,438 B2 | 8/2013 | Mishra et al. |
| 8,525,231 B2 | 9/2013 | Park et al. |
| 8,598,937 B2 | 12/2013 | Lal et al. |
| 8,603,880 B2 | 12/2013 | Yamada |
| 8,614,460 B2 | 12/2013 | Matsushita |
| 8,652,948 B2 | 2/2014 | Horie et al. |
| 8,674,407 B2 | 3/2014 | Ando et al. |
| 8,698,198 B2 | 4/2014 | Kuraguchi |
| 8,716,141 B2 | 5/2014 | Dora et al. |
| 8,772,832 B2 | 7/2014 | Boutros |
| 2003/0006437 A1 | 1/2003 | Mizuta et al. |
| 2003/0030056 A1 | 2/2003 | Callaway, Jr. |
| 2004/0119067 A1 | 6/2004 | Weeks, Jr. et al. |
| 2005/0133816 A1 | 6/2005 | Fan et al. |
| 2005/0173728 A1 | 8/2005 | Saxler |
| 2006/0076677 A1 | 4/2006 | Daubenspeck et al. |
| 2006/0145189 A1 | 7/2006 | Beach |
| 2006/0189109 A1 | 8/2006 | Fitzgerald |
| 2006/0202272 A1 | 9/2006 | Wu et al. |
| 2006/0226442 A1 | 10/2006 | Zhang et al. |
| 2006/0255364 A1 | 11/2006 | Saxler et al. |
| 2007/0018199 A1 | 1/2007 | Sheppard et al. |
| 2007/0045670 A1 | 3/2007 | Kuraguchi |
| 2007/0128743 A1 | 6/2007 | Huang et al. |
| 2007/0131968 A1 | 6/2007 | Morita et al. |
| 2007/0145417 A1 | 6/2007 | Brar et al. |
| 2007/0205433 A1 | 9/2007 | Parikh et al. |
| 2007/0210329 A1 | 9/2007 | Goto |
| 2007/0228477 A1 | 10/2007 | Suzuki et al. |
| 2007/0249119 A1 | 10/2007 | Saito |
| 2007/0295985 A1 | 12/2007 | Weeks, Jr. et al. |
| 2008/0073670 A1 | 3/2008 | Yang et al. |
| 2008/0272397 A1 | 11/2008 | Koudymov et al. |
| 2008/0308813 A1 | 12/2008 | Suh et al. |
| 2009/0045438 A1 | 2/2009 | Inoue et al. |
| 2009/0050936 A1 | 2/2009 | Oka |
| 2009/0072269 A1* | 3/2009 | Suh .............. H01L 21/8252 257/136 |
| 2009/0075455 A1 | 3/2009 | Mishra |
| 2009/0085065 A1 | 4/2009 | Mishra et al. |
| 2009/0140262 A1 | 6/2009 | Ohki et al. |
| 2009/0267078 A1 | 10/2009 | Mishra et al. |
| 2010/0065923 A1 | 3/2010 | Charles et al. |
| 2010/0133506 A1 | 6/2010 | Nakanishi et al. |
| 2010/0203234 A1 | 8/2010 | Anderson et al. |
| 2010/0219445 A1 | 9/2010 | Yokoyama et al. |
| 2011/0012110 A1 | 1/2011 | Sazawa et al. |
| 2011/0127541 A1 | 6/2011 | Wu et al. |
| 2012/0217512 A1 | 8/2012 | Renaud |
| 2012/0267637 A1 | 10/2012 | Jeon et al. |
| 2013/0056744 A1 | 3/2013 | Mishra et al. |
| 2013/0264578 A1 | 10/2013 | Mishra et al. |
| 2013/0328061 A1 | 12/2013 | Chu et al. |
| 2014/0084346 A1 | 3/2014 | Tajiri |

FOREIGN PATENT DOCUMENTS

| | | |
|---|---|---|
| CN | 101312207 | 11/2008 |
| CN | 101897029 | 11/2010 |
| CN | 102017160 | 4/2011 |
| CN | 103477543 | 12/2013 |
| CN | 103493206 | 1/2014 |
| EP | 1 998 376 | 12/2008 |
| EP | 2 188 842 | 5/2010 |
| JP | 11-224950 | 8/1999 |
| JP | 2000-058871 | 2/2000 |
| JP | 2003-229566 | 8/2003 |
| JP | 2003-244943 | 8/2003 |
| JP | 2004-260114 | 9/2004 |
| JP | 2006-032749 | 2/2006 |
| JP | 2006-033723 | 2/2006 |
| JP | 2007-036218 | 2/2007 |
| JP | 2007-215331 | 8/2007 |
| JP | 2008-199771 | 8/2008 |
| JP | 2010-087076 | 4/2010 |
| JP | 2010-525023 | 7/2010 |
| JP | 2010-539712 | 12/2010 |
| KR | 10-2010-0034921 | 4/2010 |
| KR | 2011-0033584 | 3/2011 |
| KR | 10-1046055 | 7/2011 |
| TW | 200924068 | 6/2009 |
| TW | 200924201 | 6/2009 |
| TW | 200947703 | 11/2009 |
| TW | 201010076 | 3/2010 |
| TW | 201027759 | 7/2010 |
| TW | 201027912 | 7/2010 |
| TW | 201036155 | 10/2010 |
| TW | 201322443 | 6/2013 |
| WO | WO 2004/070791 | 8/2004 |
| WO | WO 2004/098060 | 11/2004 |
| WO | WO 2005/036749 | 4/2005 |
| WO | WO 2005/070007 | 8/2005 |
| WO | WO 2005/070009 | 8/2005 |
| WO | WO 2006/114883 | 11/2006 |
| WO | WO 2007/077666 | 7/2007 |
| WO | WO 2007/108404 | 9/2007 |
| WO | WO 2008/120094 | 10/2008 |
| WO | WO 2009/036181 | 3/2009 |
| WO | WO 2009/036266 | 3/2009 |
| WO | WO 2009/039028 | 3/2009 |
| WO | WO 2009/039041 | 3/2009 |
| WO | WO 2009/076076 | 6/2009 |
| WO | WO 2009/132039 | 10/2009 |
| WO | WO 2010/039463 | 4/2010 |
| WO | WO 2010/068554 | 6/2010 |
| WO | WO 2010/090885 | 8/2010 |
| WO | WO 2010/132587 | 11/2010 |
| WO | WO 2011/031431 | 3/2011 |
| WO | WO 2011/072027 | 6/2011 |
| WO | WO 2013/052833 | 4/2013 |

OTHER PUBLICATIONS

Authorized officer Yolaine Cussac, International Preliminary Report on Patentability in PCT/US2008/076030, Mar. 25, 2010, 5 pages.
Authorized officer Chung Keun Lee, International Search Report and Written Opinion in PCT/US2008/076079, mailed Mar. 20, 2009, 11 pages.

(56) References Cited

OTHER PUBLICATIONS

Authorized officer Nora Lindner, International Preliminary Report on Patentability in PCT/US2008/076079, mailed Apr. 1, 2010, 6 pages.
Authorized officer Keon Hyeong Kim, International Search Report and Written Opinion in PCT/US2008/076160 mailed Mar. 18, 2009, 11 pages.
Authorized officer Simin Baharlou, International Preliminary Report on Patentability in PCT/US2008/076160, mailed Mar. 25, 2010, 6 pages.
Authorized officer Chung Keun Lee, International Search Report and Written Opinion in PCT/US2008/076199, mailed Mar. 24, 2009, 11 pages.
Authorized officer Dorothée Mülhausen, International Preliminary Report on Patentability in PCT/US2008/076199, mailed Apr. 1, 2010, 6 pages.
Authorized officer Keon Hyeong Kim, International Search Report and Written Opinion in PCT/US2008/085031, mailed Jun. 24, 2009, 11 pages.
Authorized officer Yolaine Cussac, International Preliminary Report on Patentability in PCT/US2008/085031, mailed Jun. 24, 2010, 6 pages.
Authorized officer Tae Hoon Kim, International Search Report and Written Opinion in PCT/US2009/041304, mailed Dec. 18, 2009, 13 pages.
Authorized officer Dorothée Mülhausen, International Preliminary Report on Patentability, in PCT/US2009/041304, mailed Nov. 4, 2010, 8 pages.
Authorized officer Sung Hee Kim, International Search Report and the Written Opinion in PCT/US2009/057554, mailed May 10, 2010, 13 pages.
Authorized Officer Gijsbertus Beijer, International Preliminary Report on Patentability in PCT/US2009/057554, mailed Mar. 29, 2011, 7 pages.
Authorized officer Cheon Whan Cho, International Search Report and Written Opinion in PCT/US2009/066647, mailed Jul. 1, 2010, 16 pages.
Authorized officer Athina Nikitas-Etienne, International Preliminary Report on Patentability in PCT/US2009/066647, mailed Jun. 23, 2011, 12 pages.
Authorized officer Sung Chan Chung, International Search Report and Written Opinion for PCT/US2010/021824, mailed Aug. 23, 2010, 9 pages.
Authorized officer Beate Giffo-Schmitt, International Preliminary Report on Patentability in PCT/US2010/021824, mailed Aug. 18, 2011, 6 pages.
Authorized officer Sang Ho Lee, International Search Report and Written Opinion in PCT/US2010/034579, mailed Dec. 24, 2010, 9 pages.
Authorized officer Nora Lindner, International Preliminary Report on Patentability in PCT/US2010/034579, mailed Nov. 24, 2011, 7 pages.
Authorized officer Jeongmin Choi, International Search Report and Written Opinion in PCT/US2010/046193, mailed Apr. 26, 2011, 13 pages.
Authorized officer Philippe Bécamel, International Preliminary Report on Patentability in PCT/US2010/046193, mailed Mar. 8, 2012, 10 pages.
Authorized officer Sang Ho Lee, International Search Report and Written Opinion in PCT/US2010/059486, mailed Jul. 26, 2011, 9 pages.
Authorized officer Nora Lindner, International Preliminary Report on Patentability in PCT/US2010/059486, mailed Jun. 21, 2012, 6 pages.
Authorized officer Kwan Sik Sul, International Search Report and Written Opinion in PCT/US2011/063975, mailed May 18, 2012, 8 pages.
Authorized officer Simin Baharlou, International Preliminary Report on Patentability in PCT/US2011/063975, mailed Jun. 27, 2013, 5 pages.
Authorized officer Sang-Taek Kim, International Search Report and Written Opinion in PCT/US2011/061407, mailed May 22, 2012, 10 pages.
Authorized officer Lingfei Bai, International Preliminary Report on Patentability in PCT/US2011/061407, mailed Jun. 6, 2013, 7 pages.
Authorized officer Kwan Sik Sul, International Search Report and Written Opinion in PCT/US2012/023160, mailed May 24, 2012, 9 pages.
Authorized officer Simin Baharlou, International Preliminary Report on Patentability in PCT/US2012/023160, mailed Aug. 15, 2013, 6 pages.
Authorized officer Jeongmin Choi, International Search Report and Written Opinion in PCT/US2012/027146, mailed Sep. 24, 2012, 12 pages.
Authorized officer Athina Nickitas-Etienne, International Preliminary Report on Patentability in PCT/US2012/027146, mailed Sep. 19, 2013, 9 pages.
Authorized officer Tae Hoon Kim, International Search Report and Written Opinion in PCT/US2013/035837, mailed Jul. 30, 2013, 9 pages.
Authorized officer Agnès Wittmann-Regis, International Preliminary Report on Patentability in PCT/US2013/035837, mailed Oct. 23, 2014, 6 pages.
Authorized officer Sang Won Choi, International Search Report and Written Opinion in PCT/US2013/048275, mailed Oct. 14, 2013, 17 pages.
Authorized officer Simin Baharlou, International Preliminary Report on Patentability in PCT/US2013/048275, mailed Jan. 8, 2015, 14 pages.
Authorized officer Hye Lyun Park, International Search Report and Written Opinion in PCT/US2013/050914, mailed Oct. 18, 2013, 11 pages.
Authorized officer Sang Won Choi, International Search Report and Written Opinion in PCT/US2013/024470, mailed May 27, 2013, 12 pages.
Authorized officer Simin Baharlou, International Preliminary Report on Patentability in PCT/US2013/024470, mailed Aug. 14, 2014, 9 pages.
Authorized officer June Young Son, International Search Report and Written Opinion in PCT/US2014/016298, mailed May 23, 2014, 15 pages.
Authorized officer Tae Hoon Kim, International Search Report and Written Opinion in PCT/US2014/027523, mailed Jul. 30, 2014, 14 pages.
Authorized officer June Young Son, International Search Report and Written Opinion in PCT/US2014/024191, mailed Aug. 7, 2014, 11 pages.
Authorized officer June Young Son, International Search Report and Written Opinion in PCT/US2014/046030, mailed Oct. 21, 2014, 12 pages.
European Search Report in Application No. 10 81 5813.0, mailed Mar. 12, 2013, 9 pages.
Search Report and Action in TW Application No. 098132132, issued Dec. 6, 2012, 8 pages.
Search Report and Action in TW Application No. 098141930, issued Jul. 10, 2014, 7 pages.
Chinese First Office Action for Application No. 200880120050.6, Aug. 2, 2011, 10 pages.
Chinese First Office Action for Application No. 200980114639.X, May 14, 2012, 13 pages.
Ando et al., "10-W/mm AlGaN-GaN HFET with a Field Modulating Plate," IEEE Electron Device Letters, 2003, 24(5):289-291.
Arulkumaran et al., "Enhancement of Breakdown Voltage by AlN Buffer Layer Thickness in AlGaN/GaN High-electron-mobility Transistors on 4 in. Diameter Silicon," Applied Physics Letters, 2005, 86:123503-1-3.
Arulkumaran et al. "Surface Passivation Effects on AlGaN/GaN High-Electron-Mobility Transistors with $SiO_2$, $Si_3N_4$, and Silicon Oxynitride," Applied Physics Letters, 2004, 84(4):613-615.
Barnett and Shinn, "Plastic and Elastic Properties of Compositionally Modulated Thin Films," Annu. Rev. Mater. Sci., 1994, 24:481-511.

(56) References Cited

OTHER PUBLICATIONS

Chen et al., "High-performance AlGaN/GaN Lateral Field-effect Rectifiers Compatible with High Electron Mobility Transistors," Applied Physics Letters, 2008, 92, 253501-1-3.
Cheng et al., "Flat GaN Epitaxial Layers Grown on Si(111) by Metalorganic Vapor Phase Epitaxy Using Step-graded AlGaN Intermediate Layers," Journal of Electronic Materials, 2006, 35(4):592-598.
Coffie, "Characterizing and Suppressing DC-to-RF Dispersion in AlGaN/GaN High Electron Mobility Transistors," 2003, PhD Thesis, University of California, Santa Barbara, 169 pages.
Coffie et al., "Unpassivated p-GaN/AlGaN/GaN HEMTs with 7.1 W/mm at 10 GhZ," Electronic Letters, 2003, 39(19):1419-1420.
Chu et al., "1200-V Normally Off GaN-on-Si Field-effect Transistors with Low Dynamic On-Resistance," IEEE Electron Device Letters, 2011, 32(5):632-634.
Dora et al., "High Breakdown Voltage Achieved on AlGaN/GaN HEMTs with Integrated Slant Field Plates," IEEE Electron Device Letters, 2006, 27(9):713-715.
Dora et al., "$ZrO_2$ Gate Dielectrics Produced by Ultraviolet Ozone Oxidation for GaN and AlGaN/GaN Transistors," J. Vac. Sci. Technol. B, 2006, 24(2)575-581.
Dora, "Understanding Material and Process Limits for High Breakdown Voltage AlGaN/GaN HEMTs," PhD Thesis, University of California, Santa Barbara, Mar. 2006, 157 pages.
Fanciulli et al., "Structural and Electrical Properties of $HfO_2$ Films Grown by Atomic Layer Deposition on Si, Ge, GaAs and GaN," Mat. Res. Soc. Symp. Proc., 2004, vol. 786, 6 pages.
Green et al., "The Effect of Surface Passivation on the Microwave Characteristics of Undoped AlGaN/GaN HEMT's," IEEE Electron Device Letters, 2000, 21(6):268 270.
Gu et al., "AlGaN/GaN MOS Transistors using Crystalline $ZrO_2$ as Gate Dielectric," Proceedings of SPIE, 2007, vol. 6473, 64730S-1-8.
Higashiwaki et al. "AlGaN/GaN Heterostructure Field-Effect Transistors on 4H—SiC Substrates with Current-Gain Cutoff Frequency of 190 GHz," Applied Physics Express, 2008, 021103-1-3.
Hwang et al., "Effects of a Molecular Beam Epitaxy Grown AlN Passivation Layer on AlGaN/GaN Heterojunction Field Effect Transistors," Solid-State Electronics, 2004, 48:363-366.
Im et al., "Normally Off GaN MOSFET Based on AlGaN/GaN Heterostructure with Extremely High 2DEG Density Grown on Silicon Substrate," IEEE Electron Device Letters, 2010, 31(3):192-194.
Karmalkar and Mishra, "Enhancement of Breakdown Voltage in AlGaN/GaN High Electron Mobility Transistors Using a Field Plate," IEEE Transactions on Electron Devices, 2001, 48(8):1515-1521.
Karmalkar and Mishra, "Very High Voltage AlGaN/GaN High Electron Mobility Transistors Using a Field Plate Deposited on a Stepped Insulator," Solid-State Electronics, 2001, 45:1645-1652.
Keller et al., "GaN-GaN Junctions with Ultrathin AlN Interlayers: Expanding Heterojunction Design," Applied Physics Letters, 2002, 80(23):4387-4389.
Khan et al., "AlGaN/GaN Metal Oxide Semiconductor Heterostructure Field Effect Transistor," IEEE Electron Device Letters, 2000, 21(2):63-65.
Kim, "Process Development and Device Characteristics of AlGaN/GaN HEMTs for High Frequency Applications," PhD Thesis, University of Illinois at Urbana-Champaign, 2007, 120 pages.
Kumar et al., "High Transconductance Enhancement-mode AlGaN/GaN HEMTs on SiC Substrate," Electronics Letters, 2003, 39(24):1758-1760.
Kuraguchi et al., "Normally-off GaN-MISFET with Well-controlled Threshold Voltage," Phys. Stats. Sol., 2007, 204(6):2010-2013.
Lanford et al., "Recessed-gate Enhancement-mode GaN HEMT with High Threshold Voltage," Electronic Letters, 2005, 41(7):449-450.
Lee et al., "Self-aligned Process for Emitter- and Base-regrowth GaN HBTs and BJTs," Solid-State Electronics, 2001, 45:243-247.

Marchand et al., "Metalorganic Chemical Vapor Deposition on GaN on Si(111): Stress Control and Application to Filed-effect Transistors," Journal of Applied Physics, 2001, 89(12):7846-7851.
Mishra et al., "AlGaN/GaN HEMTs—An Overview of Device Operation and Applications," Proceedings of the IEEE, 2002, 90(6):1022-1031.
Nanjo et al., "Remarkable Breakdown Voltage Enhancement in AlGaN Channel High Electron Mobility Transistors," Applied Physics Letters 92 (2008), 3 pages.
Napierala et al., "Selective GaN Epitaxy on Si(111) Substrates Using Porous Aluminum Oxide Buffer Layers," Journal of the Electrochemical Society, 2006. 153(2):G125-G127, 4 pages.
Ota and Nozawa, "AlGaN/GaN Recessed MIS-gate HFET with High-threshold-voltage Normally-off Operation for Power Electronics Applications," IEEE Electron Device Letters, 2008, 29(7):668-670.
Palacios et al., "AlGaN/GaN HEMTs with an InGaN-based Back-barrier," Device Research Conference Digest, 2005, DRC '05 63rd, pp. 181-182.
Palacios et al., "AlGaN/GaN High Electron Mobility Transistors with InGaN Back-Barriers," IEEE Electron Device Letters, 2006, 27(1):13-15.
Palacios et al., "Nitride-based High Electron Mobility Transistors with a GaN Spacer," Applied Physics Letters, 2006, 89:073508-1-3.
Pei et al., "Effect of Dielectric Thickness on Power Performance of AlGaN/GaN HEMTs," IEEE Electron Device Letters, 2009, 30(4):313-315.
"Planar, Low Switching Loss, Gallium Nitride Devices for Power Conversion Applications," SBIR N121-090 (Navy), 2012, 3 pages.
Rajan et al., "Advanced Transistor Structures Based on N-face GaN," 32M International Symposium on Compound Semiconductors (ISCS), Sep. 18-22, 2005, Europa-Park Rust, Germany, 2 pages.
Reiher et al., "Efficient Stress Relief in GaN Heteroepitaxy on Si(111) Using Low-temperature AlN Interlayers," Journal of Crystal Growth, 2003, 248:563-567.
Saito et al., "Recessed-gate Structure Approach Toward Normally Off High-voltage AlGaN/GaN HEMT for Power Electronics Applications," IEEE Transactions on Electron Device, 2006, 53(2):356-362.
Shelton et al., "Selective Area Growth and Characterization of AlGaN/GaN Heterojunction Bipolar Transistors by Metalorganic Chemical Vapor Deposition," IEEE Transactions on Electron Devices, 2001, 48(3):490-494.
Shen, "Advanced Polarization-based Design of AlGaN/GaN HEMTs," Jun. 2004, PhD Thesis, University of California, Santa Barbara, 192 pages.
Sugiura et al., "Enhancement-mode n-channel GaN MOSFETs Fabricated on p-GaN Using $HfO_2$ as Gate Oxide," Electronics Letters, 2007, vol. 43, No. 17, 2 pages.
Suh et al. "High-Breakdown Enhancement-mode AlGaN/GaN HEMTs with Integrated Slant Field-Plate," Electron Devices Meeting, 2006, IEDM '06 International, 3 pages.
Tipirneni et al. "Silicon Dioxide-encapsulated High-Voltage AlGaN/GaN HFETs for Power-Switching Applications," IEEE Electron Device Letters, 2007, 28(9):784-786.
Vetury et al., "Direct Measurement of Gate Depletion in High Breakdown (405V) Al/GaN/GaN Heterostructure Field Effect Transistors," IEDM 98, 1998, pp. 55-58.
Wang et al., "Comparison of the Effect of Gate Dielectric Layer on 2DEG Carrier Concentration in Strained AlGaN/GaN Heterostructure," Mater. Res. Soc. Symp. Proc., 2007, vol. 831, 6 pages.
Wang et al., "Enhancement-mode $Si_3N_4$/AlGaN/GaN MISHFETs," IEEE Electron Device Letters, 2006, 27(10):793-795.
Wu, "AlGaN/GaN Microwave Power High-Mobility Transistors," PhD Thesis, University of California, Santa Barbara, Jul. 1997, 134 pages.
Wu et al., "A 97.8% Efficient GaN HEMT Boost Converter with 300-W Output Power at 1MHz," Electronic Device Letters, 2008, IEEE, 29(8):824-826.

(56) References Cited

OTHER PUBLICATIONS

Yoshida, "AlGan/GaN Power FET," Furukawa Review, 2002, 21:7-11.

Zhang, "High Voltage GaN HEMTs with Low On-resistance for Switching Applications," PhD Thesis, University of California, Santa Barbara, Sep. 2002, 166 pages.

Zhanghong Content, Shanghai Institute of Metallurgy, Chinese Academy of Sciences, "Two-Dimensional Electron Gas and High Electron Mobility Transistor (HEMT)," Dec. 31, 1984, 17 pages.

Authorized officer Yukari Nakamura, International Preliminary Report on Patentability in PCT/US2013/050914, mailed Jan. 29, 2015, 8 pages.

* cited by examiner

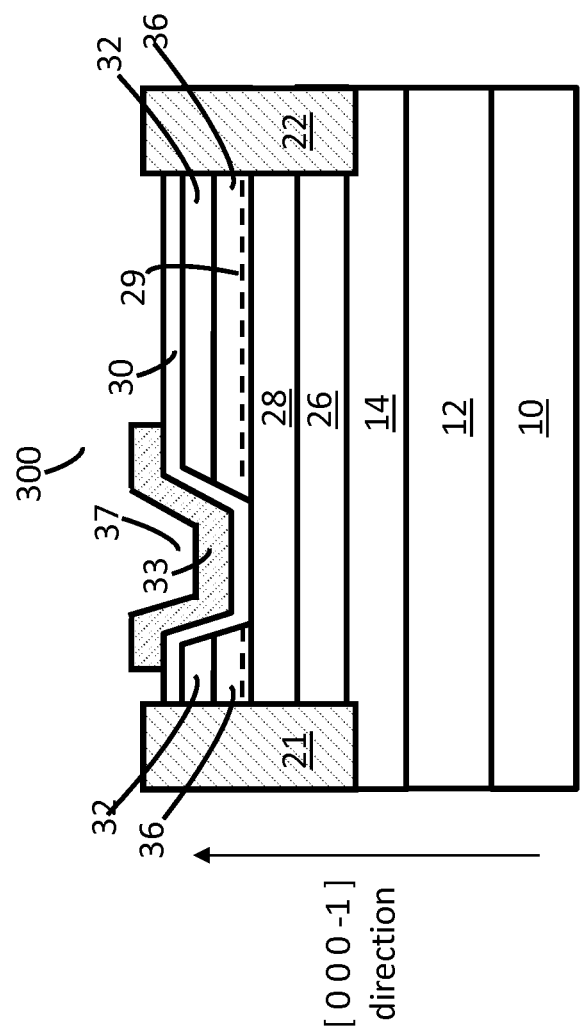

N-POLAR III-NITRIDE TRANSISTORS

CROSS-REFERENCE TO RELATED APPLICATIONS

This is a continuation of U.S. application Ser. No. 13/859,635, filed on Apr. 9, 2013, which claims priority to U.S. Provisional Application No. 61/621,956, filed on Apr. 9, 2012. The disclosures of the prior applications are considered part of and are incorporated by reference in the disclosure of this application.

TECHNICAL FIELD

This invention relates to transistors formed of III-Nitride materials having a nitrogen-polar (N-polar) orientation.

BACKGROUND

Currently, typical power semiconductor transistors, including devices such as power MOSFETs and insulated gate bipolar transistors (IGBTs), are fabricated with silicon (Si) semiconductor material. More recently, silicon carbide (SiC) power devices have been considered due to their superior properties. III-Nitride or III-N semiconductor devices, such as gallium nitride (GaN) devices, are now emerging as attractive candidates to carry large currents, support high voltages and to provide very low on-resistance and fast switching times.

Typical III-N high electron mobility transistors (HEMTs) and related devices are formed on III-Nitride materials grown in a group-III polar orientation, such as the [0 0 0 1] (C-plane) orientation. That is, the source, gate, and drain electrodes of the HEMT are formed over the group-III face (e.g., [0 0 0 1] face) of the III-N material layers, which is typically on an opposite side of the III-N material layers from the substrate on which the III-N layers are formed. Furthermore, III-N HEMTs are typically normally-on devices, which means that they conduct current when zero voltage is applied to the gate relative to the source. These normally on devices are known as depletion mode (D-mode) devices. However, it is more desirable in power electronics to have normally-off devices, called enhancement mode (E-mode) devices, that do not conduct substantial current at zero gate voltage and require a sufficiently positive voltage applied to the gate relative to the source in order to turn on. The use of E-mode devices in power electronics can help reduce the potential for damage to the device or to other circuit components by preventing accidental turn on of the device in case of circuit failure.

SUMMARY

In a one aspect of the invention, an N-polar III-N transistor is described. The transistor includes a III-N buffer layer having a first lattice constant, and a first III-N barrier layer having a second lattice constant on the III-N buffer layer. The transistor further includes a III-N channel layer on the III-N buffer layer, the III-N channel layer having a gate region and a plurality of access regions on opposite sides of the gate region. A compositional difference between the first III-N barrier layer and the III-N channel layer causes a conductive channel to be induced in the plurality of access regions of the III-N channel layer. The transistor also includes a source, a gate, a drain, and a second III-N barrier layer between the gate and the III-N channel layer. The second III-N barrier layer has an N-face proximal to the gate and a group-III face opposite the N-face, and the second III-N barrier layer has a larger bandgap than the III-N channel layer. The second lattice constant is within 0.5% of the first lattice constant.

In a second aspect of the invention, another N-polar III-N transistor is described. The transistor includes a source, a gate, a drain, a III-N buffer layer having a first lattice constant, and a first III-N barrier layer having a second lattice constant on the III-N buffer layer. The transistor also includes a III-N channel layer between the III-N buffer layer and the gate, the III-N channel layer having an N-face proximal to the gate and a group-III face opposite the N-face. The bandgap of the III-N channel layer is smaller than that of the first III-N barrier layer. The thickness of the III-N channel layer is less than 10 nanometers, and the sheet resistance of the conductive channel formed in an access region of the transistor is less than 400 ohms/square.

In a third aspect of the invention, another N-polar III-N transistor is described. The transistor includes a source, a gate, a drain, a III-N buffer layer having a first lattice constant, and a first III-N barrier layer having a second lattice constant on the III-N buffer layer. The transistor also includes a III-N channel layer on the first III-N barrier layer, the III-N channel layer having an N-face proximal to the gate and a group-III face opposite the N-face. The III-N channel layer has a smaller bandgap than the first III-N barrier layer and includes a gate region beneath the gate. The transistor further includes a second III-N barrier layer between the gate and the III-N channel layer. The second III-N barrier layer has a larger bandgap than the III-N channel layer. The second lattice constant is within 0.5% of the first lattice constant, and the transistor is configured such that a conductive channel is induced in the gate region of the III-N channel layer during a first mode of operation where a positive voltage is applied to the gate relative to the source, but not during a second mode of operation where 0 Volts is applied to the gate relative to the source.

In a fourth aspect of the invention, an enhancement-mode N-polar III-N transistor is described. The transistor includes a source, a gate, and a drain. The transistor also includes a first III-N barrier layer and a first III-N channel layer on the first III-N barrier layer. The first III-N channel layer has an N-face proximal to the gate and a group-III face opposite the N-face. The first III-N channel layer also has a smaller bandgap than the first III-N barrier layer, and the III-N channel layer includes a gate region beneath the gate and access regions on opposite sides of the gate region. The transistor further includes a second III-N barrier layer between the gate and the first III-N channel layer, the second III-N barrier layer having a larger bandgap than the first III-N channel layer. The transistor also includes a second III-N channel layer over the access regions of the first III-N channel layer, the second III-N channel layer including a first conductive channel and having a smaller bandgap than the second III-N barrier layer. The transistor is configured such that when a positive voltage is applied to the gate relative to the source, a second conductive channel is induced in the gate region of the first III-N channel layer, and the first conductive channel and the second conductive channel are electrically coupled to form a conductive path extending from the source to the drain.

The transistors described herein can include one or more of the following features. A thickness and aluminum fractional composition of a portion of the second III-N barrier over the gate region of the III-N channel layer can be selected to cause the channel to be induced in the access regions without being induced in the gate region when 0V is applied to the gate relative to the source. The second III-N barrier can be over the gate region but not over the plurality of access regions of the III-N channel layer. A thickness and aluminum fractional composition of the second III-N barrier can be selected such that in a first mode of operation where 0V is applied to the gate relative to the source, the conductive channel is induced in the plurality of access regions without being induced in the gate region. The transistor can be configured such that in a second mode of operation where a positive voltage is applied to the gate relative to the source, the conductive channel is induced in the gate region and in the plurality of access regions of the III-N channel layer. The second III-N barrier layer can have a third lattice constant within 0.5% of the first lattice constant.

The first III-N barrier layer can include an $Al_xIn_{1-x}N$ layer, and x can be between 82 and 83 or between 81 and 84. The transistor can further include an $Al_zGa_{1-z}N$ or AlN layer. The $Al_zGa_{1-z}N$ or AlN layer can be between the $Al_xIn_{1-x}N$ layer and the III-N channel layer. The thickness of the III-N channel layer can be less than 10 nanometers. The transistor can be configured such that in a first mode of operation where 0V is applied to the gate relative to the source, the conductive channel is induced in the plurality of access regions without being induced in the gate region of the III-N channel layer, and in a second mode of operation where a positive voltage is applied to the gate relative to the source, the conductive channel is induced in the gate region and in the plurality of access regions of the III-N channel layer. The III-N buffer layer can comprise GaN. The III-N channel layer can comprise GaN. The first III-N barrier layer can comprise $Al_xIn_yGa_{1-x-y}N$, and the ratio x/y can be between 82/18 and 83/17 or between 81/19 and 84/16. The transistor can further comprise an $Al_zGa_{1-z}N$ or AlN layer. The $Al_zGa_{1-z}N$ or AlN layer can be between the $Al_xIn_yGa_{1-x-y}N$ layer and the III-N channel layer. The thickness of the III-N channel layer can be less than 10 nanometers.

The second lattice constant can be within 0.5% of the first lattice constant. The transistor can further include a second III-N barrier layer between the gate and the III-N channel layer, wherein the second III-N barrier layer has a larger bandgap than the III-N channel layer. The second III-N barrier can be over a gate region of the transistor but not over the access region of the transistor. The thickness and aluminum fractional composition of the second III-N barrier can be selected such that in a first mode of operation where 0V is applied to the gate relative to the source, the conductive channel is induced in the plurality of access regions without being induced in the gate region. The transistor can be configured such that in a second mode of operation where a positive voltage is applied to the gate relative to the source, the conductive channel is induced in the gate region and in the plurality of access regions of the III-N channel layer. The first III-N barrier layer can comprise an $Al_xIn_{1-x}N$ or $Al_{x^-}In_yGa_{1-x-y}N$ layer. The threshold voltage of the transistor can be greater than 2 Volts. The breakdown voltage of the transistor can be greater than 300 Volts.

The III-N channel layer can be a first III-N channel layer, and the transistor can further comprise a second III-N channel layer having a smaller bandgap than the second III-N barrier layer, wherein the second III-N barrier layer is between the first III-N channel layer and the second III-N channel layer. The second III-N channel layer can include a recess or an aperture, and the gate can be in the recess or aperture. The compositional difference between the second III-N barrier layer and the second III-N channel layer can cause a second conductive channel to be induced in the second III-N channel layer. During the first mode of operation the conductive channel in the gate region of the first III-N channel layer and the second conductive channel in the second III-N channel layer can form a continuous electrically conductive path extending from the source to the drain. The transistor can further comprise a III-N cap layer, for example and AlInN cap layer, over the second III-N channel layer. The III-N buffer layer or the first III-N channel layer can comprise GaN. The second III-N channel layer can comprise GaN. The transistor can be configured such that when the transistor is in the ON state and conducting current from the drain to the source, the current flows through both the first and second conductive channels.

The details of one or more embodiments of the subject matter described in this specification are set forth in the accompanying drawings and the description below. Other features, aspects, and advantages of the subject matter will become apparent from the description, the drawings, and the claims.

DESCRIPTION OF DRAWINGS

FIG. 3A is a cross-sectional view of an N-polar III-Nitride enhancement-mode transistor while biased in the OFF state.

Like reference symbols in the various drawings indicate like elements.

DETAILED DESCRIPTION

Described herein are III-Nitride (i.e., III-N) transistors, and in particular enhancement-mode (E-mode) III-N transistors, for which the III-N material is oriented in an N-polar direction. The N-polar (i.e., N-face) III-N material structure is prepared either by directly growing N-polar III-N layers on a suitable substrate such as silicon, Silicon Carbide (SiC), sapphire, Aluminum Nitride (AlN), or Gallium Nitride (GaN), or by growing the layers in reverse order in a group-III polar orientation and then accessing an N-face of the III-N material structure from the reverse side of the direction of growth, for example by removing the growth substrate and optionally by removing a portion of the III-N material that was directly adjacent to the growth substrate. As used herein, the terms III-Nitride or III-N materials, layers, devices, etc., refer to a material or device comprised of a compound semiconductor material according to the stoichiometric formula $B_wAl_xIn_yGa_zN$, where w+x+y+z is about 1, $0 \leq w \leq 1$, $0 \leq x \leq 1$, $0 \leq y \leq 1$, and $0 \leq z \leq 1$. In a III-Nitride or III-N device, such as a transistor or HEMT, the conductive channel can be partially or entirely contained within a III-N material layer.

Figure 1:
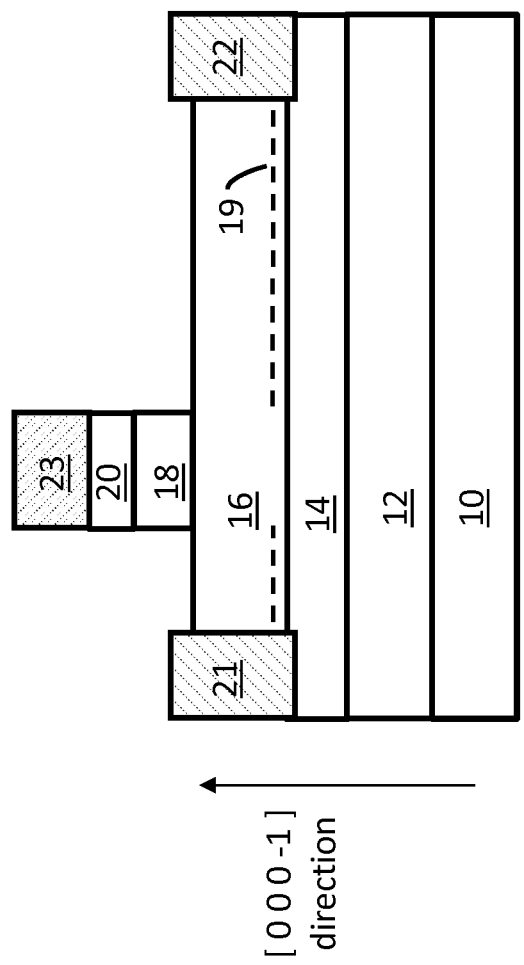
FIGS. 1 and 2 are cross-sectional views of N-polar III-Nitride enhancement-mode transistors.

An exemplary N-polar III-Nitride E-mode device is shown in FIG. 1. Layers 12, 14, 16, and 18 are N-polar III-N layers, oriented as shown in the [0 0 0 -1] direction. The III-N layers 12, 14, 16, and 18 are optionally on a substrate 10 such as silicon, SiC, sapphire, AlN, GaN, or other substrate material suitable for epitaxial growth of III-Nitride layers. In some implementations the substrate 10 may be omitted. A gate 23 is over III-N layer 18, with an insulating layer 20 optionally included between gate 23 and layer 18. As seen, the source and drain contacts 21 and 22, as well as the gate 23, are all formed over the N-face (e.g., [0 0 0 -1] face) of the III-N material layers, which is on an opposite side of the III-N material layers from the substrate 10. Source and drain contacts 21 and 22, respectively, are on opposite sides of the gate 23 and contact the device 2DEG channel 19 that is formed in layer 16. The portions of the III-N materials directly below the gate 23 are referred to as the gate region of the device. The portions of the III-N materials directly below the source and drain 21 and 22, are respectively referred to as the source and drain regions of the device. The portions of III-N material between the gate region and the source region, and between the gate region and the drain region, are referred to as the device access regions.

Layer 12 is a III-N buffer layer, which can for example be GaN. The buffer layer 12 can be rendered insulating or substantially free of n-type mobile carriers by including dislocations or point defects in the layer, or by doping the layer with compensating elements, such as Fe, C, and/or Mg. The buffer layer can have a substantially uniform composition throughout, or the composition can vary. For example, in some implementations the buffer layer is graded, such as by grading the aluminum composition in the buffer layer. The buffer layer 12 can be substantially thicker than any of the other III-Nitride layers in the structure. For example, buffer layer 12 may have a thickness that is at least 10 times, but typically at least 30 times, the combined thickness of the III-N layers between buffer layer 12 and the gate 23.

Layer 14 is a back-barrier III-N layer (i.e., a first III-N barrier layer). Layer 16 is a III-N channel layer, which can be formed of GaN. Layer 18 is a gate-barrier III-N layer (i.e., a second III-N barrier layer). The back-barrier III-N layer 14 has a larger bandgap than the channel layer 16, such that a 2DEG channel 19 is induced in the access regions of the channel layer 16 adjacent the interface between the back-barrier III-N layer 14 and the channel layer 16.

The portion of the 2DEG in the access regions is populated with conductive charge both when the gate 23 is biased relative to the source 21 at a voltage greater than the device threshold voltage, and when the gate 23 is biased relative to the source 21 at a voltage less than the device threshold voltage. In order to prevent surface roughening at the surface of channel layer 16 closest to back-barrier layer 14, back barrier layer 14 can have a lattice constant that is within 0.5% or within 0.2% of that of the buffer layer 12. For example, when at least a substantial portion of the thickness of layer 12, for example at least half the thickness of layer 12, is GaN, layer 14 can be $Al_xIn_yGa_zN$, where x+y+z is about 1 and the ratio x/y is between about 81/19 and 84/16. In other implementations, layer 14 includes AlInN, where the Al composition is between 0.82 and 0.83 or between 0.81 and 0.84.

It has been found that when back barrier layer 14 has a lattice constant that is within 0.5%, or within 0.2% of that of the buffer layer 12, both the sheet charge carrier density and the carrier mobility in the 2DEG in the access regions is increased, resulting in a substantially lower sheet resistance of the 2DEG in the access regions. For example, when $Al_{.82}In_{.18}N$ is used for the back barrier layer 14 and GaN is used for the buffer layer 12 and for the channel layer 16, a sheet charge carrier density of about $1.7 \times 10^{13}$ cm$^{-3}$ and a mobility of about 1100 cm$^2$/V·s is achieved, resulting in a sheet resistance of about 334 ohms/square, which is less than 400 ohms/square. This is a substantially lower sheet resistance than has previously been reported for N-polar III-N devices. For comparison, when the back barrier layer in the structure described above was replaced with an $Al_wGa_{1-w}N$ layer with w between 0.41 and 0.61, the highest sheet charge carrier density achieved was about $1.3 \times 10^{13}$ cm$^{-3}$, which occurred when w=0.41. The highest mobility achieved was about 524 cm$^2$/V·s, which occurred when w=0.61. The lowest sheet resistance achieved was greater than 1090 ohms/square, which also occurred when w=0.61. It was unexpected that such an improvement in the 2DEG sheet charge carrier density, mobility, and sheet resistance could be achieved by utilizing a back barrier layer with a lattice constant that is within 0.5%, or within 0.2% of that of the buffer layer.

In some implementations, an additional AlN layer or $Al_xGa_{1-x}N$ layer (not shown), preferably with x>0.5, is included either between layers 14 and 16 or between layers 12 and 14, or both. The additional AlN or $Al_xGa_{1-x}N$ layer(s) can have a larger bandgap than the back-barrier layer 14, and may have a lattice constant which is smaller than that of buffer layer 12, in order to increase the charge density in the portion of 2DEG 19 which is in the device access regions.

In order to minimize the resistance of the channel in the device access regions (i.e., the access resistance of the device), such that resistive losses are not too large in high-voltage switching applications, the sheet resistance of the 2DEG 19 in the access regions should be kept below 400 ohms/square. The access resistance typically increases with decreasing n-type impurity concentration in layer 14, decreasing thickness of layer 14, and decreasing thickness of layer 16. For example, if layer 14 is AlInN that has a thickness of about 15 nanometers and is doped with n-type impurities at a concentration of about $4 \times 10^{18}$ cm$^{-3}$, the thickness of the channel layer can be less than 15 nm, but is typically less than 10 nm. In devices that have such a low access resistance, the carrier concentration in the portion of the 2DEG 19 which is in the access regions is typically greater than $1 \times 10^{13}$ cm$^{-2}$, and can be as high as $1.7 \times 10^{13}$ cm$^{-2}$ or higher. In previous N-polar E-mode transistors that do not include a back-barrier having a lattice constant so closely matched to that of the buffer layer 12, such low access sheet resistances could not be achieved with such a thin channel layer 16, i.e., less than 10 nanometers. Having such a thin channel layer can improve the coupling between the gate and the channel in the gate region, as well as relaxing the requirements necessary for achieving an E-mode device, as will be described below.

Still referring to FIG. 1, III-N layer 18 depletes the portion of the 2DEG channel 19 in the gate region, such that when 0V is applied to the gate relative to the source, the 2DEG 19 is substantially depleted in the gate region and the device is in the off state. A positive voltage must be applied to the gate relative to the source in order to populate the 2DEG 19 in the gate region with carriers (electrons) and thereby turn the device on. The minimum gate voltage (relative to the source) required to turn the device on is known as the device threshold voltage.

In order for the portion of 2DEG channel 19 in the gate region to be depleted of mobile charge when 0V is applied to the gate 23 relative to the source 21, layer 18 is sufficiently thick, for example thicker than 10 nanometers, and typically has a bandgap that is greater than that of channel layer 14, which can be achieved by ensuring that layer 18 has a sufficiently large aluminum fractional composition. To enable a sufficiently thick gate-barrier layer 18, the gate barrier layer 18 can be formed of a III-N material having a lattice constant that is within 0.5% or within 0.2% of that of the buffer layer 12. For example, when at least a substantial portion of the thickness of layer 12 (i.e., at least half the thickness of layer 12) is GaN, layer 18 can be $Al_xIn_yGa_zN$, where x+y+z is about 1 and the ratio x/y is between about 81/19 and 84/16. In some implementations, layer 18 includes AlInN (i.e., $Al_xIn_{1-x}N$), where the Al composition x is between 0.82 and 0.83.

In many cases, layer 18 is unintentionally doped n-type, for example as a result of impurities being incorporated into the layer during growth. Layer 18 can therefore include p-type dopants to counterbalance the incorporated n-type impurities and further increase the threshold voltage of the device. In cases where layer 18 is substantially depleted of mobile charge carriers, the device can be formed either with or without insulator layer 20. However, if the p-type dopants induce a substantial concentration of holes in the gate-barrier layer 18, the device may be rendered inoperable if the insulator layer 20 is included. In this case, the device is formed without an insulator layer 20 between gate 23 and layer 18, or with gate 23 contacting at least a portion of the surface of layer 18 closest to the gate 23.

Figure 2:
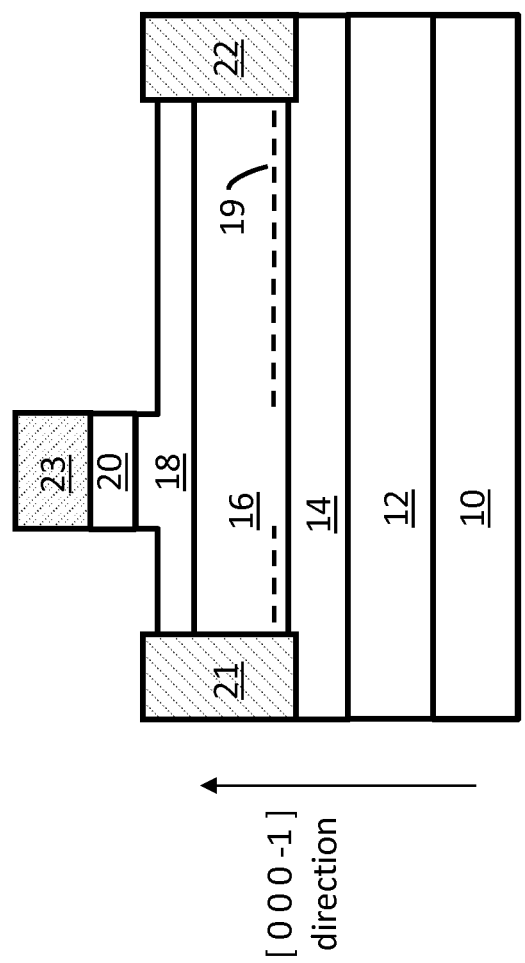

As seen in FIG. 2, in some implementations layer 18 extends all the way from source 21 to drain 22, or at least a portion of layer 18 is over the portion of 2DEG channel 19 in the access regions. In order to ensure that the portion of the 2DEG channel 19 in the access regions is not depleted of mobile charge, which would render the device inoperable, the portion of layer 18 in the access regions is made thinner than the portion beneath the gate. Alternatively, the portion of layer 18 in the access regions could have a lower p-type doping concentration than the portion of layer 18 underneath the gate.

Figure 3B:
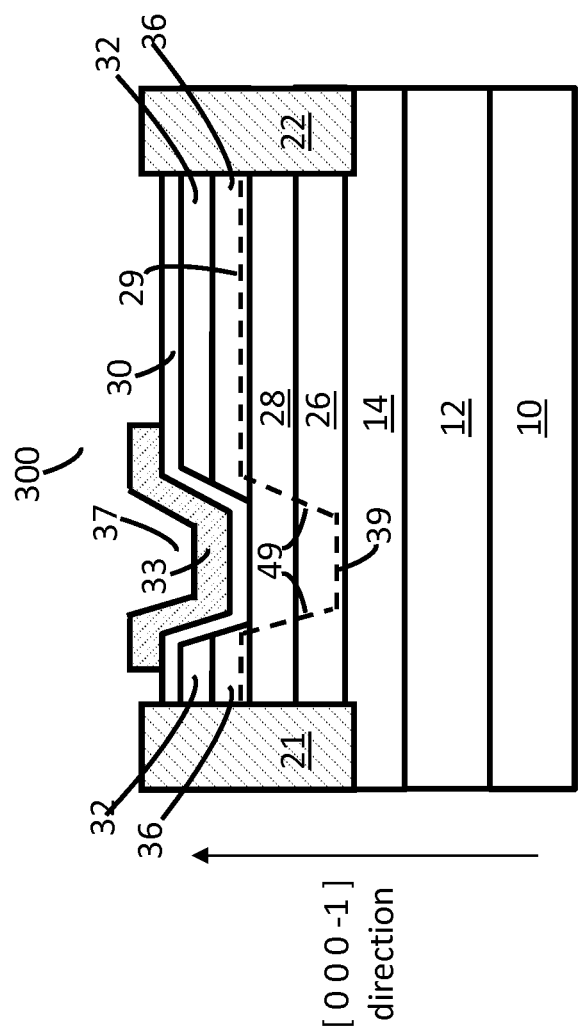
FIG. 3B is a cross-sectional view of the transistor of FIG. 3A while biased in the ON state.

Another N-polar III-Nitride E-mode transistor 300 is shown in FIGS. 3A and 3B. FIG. 3A illustrates the transistor 300 while 0V is applied to the gate relative to the source, such that the transistor is biased OFF, and FIG. 3B illustrates the transistor 300 when a positive voltage greater than the threshold voltage of the transistor is applied to the gate relative to the source, such that the transistor is biased ON. Similarly to the transistors of FIGS. 1 and 2, transistor 300 optionally includes a substrate 10, and also includes a III-N buffer layer 12 and a first III-N barrier layer 14 on the III-N buffer layer 12. A first III-N channel layer 26 is on the first III-N barrier layer 14, and a second III-N barrier layer 28 is on the first III-N channel layer 26. Transistor 300 also includes a second III-N channel layer 36 on the second III-N barrier layer 28, and optionally includes a III-N cap layer 32 on the second III-N channel layer 36. An aperture or recess 37 is formed in the III-N channel layer 36 over the gate region of the transistor. In FIG. 3A, layers 30 and 33 already have been formed in this aperture or recess. The aperture or recess 37 is shown to extend through the entire thickness of the III-N channel layer 36, but it may optionally extend only partially through the III-N channel layer 36 (not shown). When the III-N cap layer 32 is included, the aperture or recess 37 is formed through the entire thickness of the III-N cap layer 32, as shown, before layer 30 and gate 33 are formed. After forming the recess or aperture 37, insulator layer 30 is deposited conformally over the exposed upper surface of III-N material, including in the recess or aperture 37, as shown. Gate 33 is then formed over the insulator layer and is at least partially in the recess or aperture 37. Source and drain contacts 21 and 22, respectively, are on opposite sides of the gate 33. In some implementations, insulator layer 30 is not included, and gate 33 is formed directly on the III-N material layers (not shown).

The compositions and thicknesses of the layers in transistor 300 are selected as follows. As in the transistors of FIGS. 1 and 2, the III-N buffer layer 12 can be substantially thicker than any of the other III-Nitride layers in the structure. For example, layer 12 may have a thickness that is at least 10 times, but typically at least 30 times, the combined thickness of the other III-N layers. In some implementations, the III-N buffer layer includes or is formed of GaN. In other implementations, the upper portion of the III-N buffer layer 12 (i.e., the portion of layer 12 closest to layer 14) is GaN. When the III-N buffer layer 12 is substantially thicker than the other III-Nitride layers in the structure, the other III-N layers are strained unless their lattice constants are about the same as that of the III-N buffer layer 12.

The first III-N barrier layer 14 may have a lattice constant that is substantially the same as that of III-N buffer layer 12, such that the first III-N barrier layer 14 is under little or no strain. That is, the lattice constant of the first III-N barrier layer 14 may be within 0.5% or within 0.2% of the lattice constant of the III-N buffer layer 12. The first III-N barrier layer 14 also has a bandgap which is larger than that of the first III-N channel layer 26. For example, when the first III-N channel layer 26 and the upper portion of the III-N buffer layer 12 are GaN, the first III-N barrier layer 14 can be formed of or include AlInN (i.e., $Al_xIn_{1-x}N$), where the Al composition x is between 0.82 and 0.83 or between 0.81 and 0.84. Alternatively, when the first III-N channel layer 26 and the upper portion of the III-N buffer layer 12 are GaN, the first III-N barrier layer 14 can be formed of or include $Al_xIn_yGa_zN$, where x+y+z is about 1 and the ratio x/y is between about 81/19 and 84/16. In some implementations, an additional AlN layer or $Al_xGa_{1-x}N$ layer (not shown), preferably with x>0.5, is included either between layers 14 and 26 or between layers 12 and 14, or both. The additional AlN or $Al_xGa_{1-x}N$ layer(s) can have a larger bandgap than that of the first III-N barrier layer 14, and may have a lattice constant which is smaller than that of III-N buffer layer 12, in order to increase the charge density in the second 2DEG 39 (shown in FIG. 3B) which is induced in the first III-N channel layer 26 when the gate of transistor 300 is biased on, as further described below.

The second III-N barrier layer 28 has a bandgap which is larger than that of both the first III-N channel layer 26 and the second III-N channel layer 36, and the composition of layer 28 can be selected such that its lattice constant is substantially the same as that of III-N buffer layer 12, so that the second III-N barrier layer 28 is under little or no strain. That is, the lattice constant of the second III-N barrier layer 28 may be within 0.5% or within 0.2% of the lattice constant of the III-N buffer layer 12. For example, when the first and second III-N channel layers 26 and 36, as well as the upper portion of the III-N buffer layer 12, are all GaN, the second III-N barrier layer 28 can be formed of or include AlInN (i.e., $Al_xIn_{1-x}N$), where the Al composition x is between 0.82 and 0.83 or between 0.81 and 0.84. Alternatively, the second III-N barrier layer 28 can be formed of or include $Al_xIn_yGa_zN$, where x+y+z is about 1 and the ratio x/y is between about 81/19 and 84/16. In another implementation, the second III-N barrier layer 28 can be formed of or include AlN or AlGaN, having a larger bandgap than both layers 26 and 36, but having a smaller lattice constant than the III-N buffer layer 12.

The thickness of the second III-N barrier layer 28 is selected to be large enough that the second 2DEG 39 is substantially depleted of charge, or mobile charge is not induced in the gate region of the first III-N channel layer 26, when 0 Volts is applied to the gate 33 relative to the source 21, as illustrated in FIG. 3A. That is, during the fabrication of transistor 300, immediately after the formation of layer 26 and before the formation of any of the layers overlying layer 26, a 2DEG channel (not shown) is induced in layer 26 adjacent to the interface between layers 26 and 14. As layer 28 is deposited over layer 26, the charge concentration in the induced 2DEG gradually decreases as layer 28 is made thicker. There exists a minimum thickness for layer 28, the minimum thickness depending on the compositions of layers 26 and 28 as well as the thickness of layer 26, such that when layer 28 is grown thicker than this minimum thickness, the induced 2DEG becomes substantially depleted of charge and hence ceases to be conductive. In transistor 300, layer 28 is made thicker than this minimum thickness, thereby ensuring that 2DEG 39 is induced in the gate region of the first III-N channel layer 26 when a positive voltage greater than the transistor threshold voltage is applied to the gate 33 relative to the source 21, but not when 0V is applied to the gate relative to the source. For example, when the first III-N channel layer 26 is GaN and is about 5 nanometers or thinner, and the second III-N barrier layer 28 is $Al_{w}In_{1-w}N$ with w approximately in the range of 0.82 to 0.83, layer 28 can be at least 2 nanometers, between 2 and 10 nanometers, or between 2 and 6 nanometers.

The second III-N channel layer 36, which can for example be formed of or include GaN, has a smaller bandgap than the second III-N barrier layer 28, such that 2DEG channel 29 is induced in layer 36 both when the gate of transistor 300 is biased ON and when the gate of transistor 300 is biased OFF. For a given composition of layers 28 and 36, the mobile charge density in 2DEG 29 depends on the thickness of layer 36. Increasing the thickness of layer 36 tends to increase the mobile charge carrier density in 2DEG channel 29. Having a higher 2DEG mobile carrier density can decrease the sheet resistance in the access regions of the transistor 300, leading to lower conductive losses in the transistor during operation. However, a higher 2DEG mobile carrier density also results in a lower breakdown voltage of the device. Hence, when the transistor 300 is used in applications that require a minimum transistor breakdown voltage, the thickness of layer 36 can be selected such that the resulting 2DEG mobile carrier density is about equal to or just below the carrier density that results in the transistor having the required minimum breakdown voltage.

In some implementations, an additional AlN layer or $Al_xGa_{1-x}N$ layer (not shown), preferably with x>0.5, is included either between layers 28 and 26 or between layers 28 and 36, or both. The additional AlN or $Al_xGa_{1-x}N$ layer(s) can have a larger bandgap than that of the second III-N barrier layer 28, and may have a lattice constant which is smaller than that of III-N buffer layer 12, in order to increase the charge density and/or the mobility of the 2DEG 29 which is induced in the second III-N channel layer 36 in the access regions of the transistor 300.

The III-N cap layer 32, when included in transistor 300, can have a larger bandgap than the second III-N channel layer 36, which in some implementations increases the breakdown voltage of the transistor. Alternatively, the cap layer 32 may have a bandgap which is smaller than or similar to that of layer 36, provided the conduction band edge of the cap layer 32 at the interface between layers 32 and 36 is at a higher absolute energy than the conduction band edge of the layer 36 at the interface between layers 32 and 36. III-N cap layer 32 may also be designed to have a similar lattice constant to that of III-N buffer layer 12. For example, when layers 12 and 36 are both GaN, the III-N cap layer 32 can be formed of or include AlInN (i.e., $Al_xIn_{1-x}N$), where the Al composition x is between 0.82 and 0.83 or between 0.81 and 0.84. Alternatively, the III-N cap layer 32 can be formed of or include $Al_xIn_yGa_zN$, where x+y+z is about 1 and the ratio x/y is between about 81/19 and 84/16. Including the III-N cap layer 32 increases the separation between the uppermost III-N surface and the 2DEG 29 in the access regions of the transistor 300, which can reduce dispersion in the transistor during operation.

Insulator layer 30, which can for example be formed of or include silicon nitride, aluminum oxide, aluminum nitride, silicon dioxide, or various combinations of these insulator materials, serves as a gate insulator layer, which reduces gate leakage in the device. Insulator layer 30 can also serve as a surface passivation layer in the access regions of the transistor 300, in order to minimize or reduce dispersion transistor during operation.

The transistor 300 of FIGS. 3A and 3B operates as follows. As seen in FIG. 3A, when the transistor 300 is biased OFF, for example with 0 Volts applied to the gate 33 relative to the source 21, conductive 2DEG channel 29 is in the access regions of the transistor 300 in layer 36, but no conductive channel is present in the gate region of the transistor. Referring to FIG. 3B, when the transistor 300 is biased ON, for example by applying a sufficiently positive voltage to the gate 33 relative to the source 21, 2DEG channel 39 is induced in layer 26 in the gate region of the device. The positive gate voltage can also induce conductive portions 49, which electrically connect 2DEGs 29 and 39, thereby forming a continuous electrically conductive path extending from the source 21 to the drain 22.

Still referring to FIG. 3B, having the portion of the channel in the access regions be in a different layer from the portion of the channel in the gate region can be advantageous in that the design parameters for the gate and access regions of the device can be decoupled from one another. That is, in the transistors of FIGS. 1 and 2, designing the device to have a higher mobile carrier charge density in the access regions of the transistor reduces the maximum threshold voltage that can be obtained for the transistor. On the other hand, for transistor 300 of FIGS. 3A and 3B, the transistor threshold voltage and the mobile carrier charge density in the access regions of the transistor can be controlled independently of one another. For example, the thickness of layers 26 and 28 can be selected to produce the desired threshold voltage of the transistor, and the thickness of layer 36 can then be selected to produce the desired charge density in 2DEG 29 in the device access regions, since varying the thickness of layer 36 does not substantially vary the transistor threshold voltage. For example, layers 26 and 28 can each be less than 6 nanometers thick, such as about 3 nanometers thick, while layer 36 can be greater than 10 nanometers thick, such as about 15 nanometers thick. Having the device channel in the access regions of the device be in a different layer from the device channel in the gate region of the device, and in particular having layer 36 (which contains the 2DEG in the device access regions) be at least 2 times or at least 3 times as thick as layer 26 (which contains the 2DEG in the gate region of the device), can result in an N-Polar enhancement-mode III-Nitride transistor having a breakdown voltage greater than 300 Volts or greater than 600 Volts, a channel sheet resistance of less than 400 ohms/square in the access regions of the device while maintaining a threshold voltage of at least 2 Volts. Furthermore, because the source and drain contacts 21 and 22, respectively, do not need to be formed through a barrier layer, the source and drain contact resistances can be less than 2 ohm-mm.

A number of implementations have been described. Nevertheless, it will be understood that various modifications may be made without departing from the spirit and scope of the techniques and devices described herein. For example, an additional AlN layer or $Al_zGa_{1-z}N$ layer (not shown) with z>0.5 or z>0.8 can be included between layers 18 and 16 in either device of FIG. 1 or FIG. 2. The additional AlN or $Al_xGa_{1-x}N$ layer can have a larger bandgap than the gate-barrier layer 18, and may have a lattice constant which is smaller than that of buffer layer 12, in order to increase the charge density in the 2DEG 19. Or, the portion of the buffer layer 12 which is closest to barrier layer 14 can be undoped or unintentionally doped and can be formed of GaN, and optionally an n-type III-N layer such as n-type GaN can be included between the buffer layer 12 and the barrier layer 14. Furthermore, III-N barrier layer 14 or 28 can be made very thin, and can for example be a finite thickness that is less than 1 nanometer, for example about 0.5 nanometers or less. Having such a thin barrier layer can result in a larger mobility for a given charge density in the 2DEG in the transistor access regions. As such, a given sheet resistance in the transistor access regions can be achieved with a lower 2DEG charge density in the access regions, thereby resulting in a larger breakdown voltage. Additionally, in transistor 300 of FIGS. 3A and 3B, an additional p-type III-N layer (not shown) can be included between the gate 37 and the underlying III-N layer 26 or 28 in the recess or aperture 37. When the additional p-type III-N layer is included, the gate 33 can directly contact the p-type III-N layer. In this case, the portion of layer 30 in the gate region can be omitted, such that layer 30 is over the device access regions but is not in the gate region of the transistor. Accordingly, the scope of the disclosure is governed by the following claims.

What is claimed is:

1. A method of forming an N-polar III-N transistor, comprising:
   providing a III-N buffer layer having a first lattice constant;
   providing a first III-N barrier having a second lattice constant on the III-N buffer layer;
   providing a III-N channel layer on the III-N buffer layer, the III-N channel layer having a gate region and a plurality of access regions on opposite sides of the gate region;
   providing a source, a gate, and a drain; and
   providing a second III-N barrier layer between the gate and the III-N channel layer, the second III-N barrier being over the gate region but not over the plurality of access regions of the III-N channel layer, the second III-N barrier layer having an N-face proximal to the gate and a group III-face opposite the N-face, and the second III-N barrier layer having a larger bandgap than the III-N channel layer; wherein
   a compositional difference between the first III-N barrier layer and the III-N channel layer causes a conductive channel to be induced in the plurality of access regions of the III-N channel layer; and
   the second lattice constant is within 0.5% of the first lattice constant.

2. The method of claim 1, wherein a thickness and aluminum fractional composition of the second III-N barrier are selected to cause the channel to be induced in the access regions without being induced in the gate region when 0V is applied to the gate relative to the source.

3. The method of claim 1, wherein a thickness and aluminum fractional composition of the second III-N barrier are selected such that in a first mode of operation where 0V is applied to the gate relative to the source, the conductive channel is induced in the plurality of access regions without being induced in the gate region.

4. The method of claim 3, wherein the transistor is configured such that in a second mode of operation where a positive voltage is applied to the gate relative to the source, the conductive channel is induced in the gate region and in the plurality of access regions of the III-N channel layer.

5. The method of claim 1, wherein the second III-N barrier layer has a third lattice constant within 0.5% of the first lattice constant.

6. The method of claim 1, wherein the first III-N barrier layer comprises an $Al_xIn_{1-x}N$ layer.

7. The method of claim 6, wherein x is between 0.82 and 0.83.

8. The method of claim 6, wherein x is between 0.81 and 0.84.

9. The method of claim 8, further comprising providing an $Al_zGa_{1-z}N$ or AlN layer.

10. The method of claim 9, wherein the $Al_zGa_{1-z}N$ or AlN layer is provided between the $Al_xIn_{1-x}N$ layer and the III-N channel layer.

11. The method of claim 8, wherein a thickness of the III-N channel layer is less than 10 nanometers.

12. The method of claim 11, wherein the transistor is configured such that in a first mode of operation where 0V is applied to the gate relative to the source, the conductive channel is induced in the plurality of access regions without being induced in the gate region of the III-N channel layer, and in a second mode of operation where a positive voltage is applied to the gate relative to the source, the conductive channel is induced in the gate region and in the plurality of access regions of the III-N channel layer.

13. The method of claim 8, wherein the III-N buffer layer comprises GaN.

14. The method of claim 8, wherein the III-N channel layer comprises GaN.

15. The method of claim 1, wherein the first III-N barrier layer comprises $Al_xIn_yGa_{1-x-y}N$.

16. The method of claim 15, wherein a ratio x/y is between 82/18 and 83/17.

17. The method of claim 15, wherein a ratio x/y is between 81/19 and 84/16.

18. The method of claim 17, further comprising providing an $Al_zGa_{1-z}N$ or AlN layer.

19. The method of claim 18, wherein the $Al_zGa_{1-z}N$ or AlN layer is provided between the $Al_xIn_yGa_{1-x-y}N$ layer and the III-N channel layer.

20. The method of claim 17, wherein a thickness of the III-N channel layer is less than 10 nanometers.

21. The method of claim 20, wherein the transistor is configured such that in a first mode of operation where 0V is applied to the gate relative to the source, the conductive channel is induced in the plurality of access regions without being induced in the gate region of the III-N channel layer, and in a second mode of operation where a positive voltage is applied to the gate relative to the source, the conductive channel is induced in the gate region and in the plurality of access regions of the III-N channel layer.

22. A method of forming an N-polar III-N transistor, comprising:
   providing a III-N buffer layer having a first lattice constant;
   providing a first III-N barrier layer having a second lattice constant on the III-N buffer layer;
   providing a source, a gate, and a drain;
   providing a III-N channel layer between the III-N buffer layer and the gate, the III-N channel layer having an N-face proximal to the gate and a group-III face opposite the N-face, the III-N channel layer having a smaller bandgap than the first III-N barrier layer; and
   providing a second III-N barrier layer between the gate and the III-N channel layer, the second III-N barrier being over a gate region of the transistor but not over an access region of the transistor, the second III-N barrier layer having a larger bandgap than the III-N channel layer; wherein a thickness of the III-N channel layer is less than 10 nanometers; and a sheet resistance of a conductive channel formed in an access region of the transistor is less than 400 ohms/square.

23. The method of claim 22, wherein a thickness and aluminum fractional composition of the second III-N barrier are selected such that in a first mode of operation where 0V is applied to the gate relative to the source, the conductive channel is induced in the plurality of access regions without being induced in the gate region.

24. The method of claim 23, wherein the transistor is configured such that in a second mode of operation where a positive voltage is applied to the gate relative to the source, the conductive channel is induced in the gate region and in the plurality of access regions of the III-N channel layer.

25. The method of claim 22, wherein the first III-N barrier layer comprises an $Al_xIn_{1-x}N$ or $Al_xIn_yGa_{1-x-y}N$ layer.

26. The method of claim 25, wherein the first III-N barrier layer comprises an $Al_xIn_yGa_{1-x-y}N$ layer with x/y being between 81/19 and 84/16.

27. The method of claim 25, wherein x is between 0.81 and 0.84.

28. The method of claim 27, further comprising providing an $Al_yGa_{1-y}N$ or AlN layer between the first III-N barrier layer and the III-N channel layer.

29. The method of claim 22, wherein the transistor is configured such that a threshold voltage of the transistor is greater than 2 Volts.

30. The method of claim 29, wherein the transistor is configured such that a breakdown voltage of the transistor is greater than 300 Volts.

31. A method of forming an enhancement-mode N-polar III-N transistor, comprising:

providing a III-N buffer layer having a first lattice constant;

providing a first III-N barrier layer having a second lattice constant on the III-N buffer layer;

providing a source, a gate, and a drain;

providing a first III-N channel layer on the first III-N barrier layer, the first III-N channel layer having an N-face proximal to the gate and a group-III face opposite the N-face, the first III-N channel layer having a smaller bandgap than the first III-N barrier layer, the first III-N channel layer including a gate region beneath the gate;

providing a second III-N barrier layer between the gate and the first III-N channel layer, the second III-N barrier layer having a larger bandgap than the first III-N channel layer; and providing a second III-N channel layer having a smaller bandgap than the second III-N barrier layer, the second III-N barrier layer being between the first III-N channel layer and the second III-N channel layer; wherein the second lattice constant is within 0.5% of the first lattice constant; and the transistor is configured such that a conductive channel is induced in the gate region of the III-N channel layer during a first mode of operation where a positive voltage is applied to the gate relative to the source, but not during a second mode of operation where 0 Volts is applied to the gate relative to the source.

32. The method of claim 31, wherein the second III-N channel layer includes a recess or an aperture, and the gate is in the recess or aperture.

33. The method of claim 32, wherein a compositional difference between the second III-N barrier layer and the second III-N channel layer causes a second conductive channel to be induced in the second III-N channel layer.

34. The method of claim 33, wherein during the first mode of operation the conductive channel in the gate region of the first III-N channel layer and the second conductive channel in the second III-N channel layer form a continuous electrically conductive path extending from the source to the drain.

35. The method of claim 34, further comprising providing a III-N cap layer over the second III-N channel layer.

36. The method of claim 34, wherein the III-N buffer layer or the first III-N channel layer comprises GaN.

37. The method of claim 36, wherein the second III-N channel layer comprises GaN.

38. A method of forming an enhancement-mode N-polar III-N transistor, comprising:

providing a first III-N barrier layer;

providing a source, a gate, and a drain;

providing a first III-N channel layer on the first III-N barrier layer, the first III-N channel layer having an N-face proximal to the gate and a group-III face opposite the N-face, the first III-N channel layer having a smaller bandgap than the first III-N barrier layer, the first III-N channel layer including a gate region beneath the gate and access regions on opposite sides of the gate region;

providing a second III-N barrier layer between the gate and the first III-N channel layer, the second III-N barrier layer having a larger bandgap than the first III-N channel layer; and providing a second III-N channel layer over the access regions of the first III-N channel layer, the second III-N channel layer including a first conductive channel and having a smaller bandgap than the second III-N barrier layer; wherein the transistor is configured such that when a positive voltage is applied to the gate relative to the source, a second conductive channel is induced in the gate region of the first III-N channel layer, and the first conductive channel and the second conductive channel are electrically coupled to form a conductive path extending from the source to the drain.

39. The method of claim 38, wherein the transistor is configured such that when the transistor is in the ON state and conducting current from the drain to the source, the current flows through both the first and second conductive channels.

* * * * *